US012660367B2

(12) United States Patent
Liu et al.

(10) Patent No.:  US 12,660,367 B2
(45) Date of Patent:      Jun. 16, 2026

(54) CONDUCTIVE PASTE AND SOLAR CELL

(71) Applicant: TRINA SOLAR CO., LTD.,
Changzhou (CN)

(72) Inventors: Chengfa Liu, Changzhou (CN);
Dongyun Lv, Changzhou (CN); **Hong
Chen**, Changzhou (CN)

(73) Assignee: TRINA SOLAR CO., LTD.,
Changzhou (CN)

( * ) Notice: Subject to any disclaimer, the term of this
patent is extended or adjusted under 35
U.S.C. 154(b) by 0 days.

(21) Appl. No.: 18/757,310

(22) Filed: Jun. 27, 2024

(65) Prior Publication Data

US 2024/0347650 A1      Oct. 17, 2024

(30) Foreign Application Priority Data

Dec. 29, 2023    (CN) .......................... 202311849621.2

(51) Int. Cl.
*H10F 77/20*      (2025.01)
*H01B 1/16*      (2006.01)
*H10F 77/30*      (2025.01)

(52) U.S. Cl.
CPC ............. *H10F 77/215* (2025.01); *H01B 1/16*
(2013.01); *H10F 77/219* (2025.01); *H10F
77/315* (2025.01)

(58) Field of Classification Search
CPC .... H10F 77/215; H10F 77/219; H10F 77/315;
H10F 77/211; H01B 1/16; H01B 1/22
See application file for complete search history.

(56) References Cited

U.S. PATENT DOCUMENTS

| | | |
|---|---|---|
| 9,834,470 B1 | 12/2017 | Hilali et al. |
| 2015/0027524 A1 | 1/2015 | Seyedmohammadi et al. |
| 2015/0243812 A1 | 8/2015 | Hardin et al. |
| 2015/0357489 A1 | 12/2015 | König et al. |
| 2016/0247950 A1 | 8/2016 | Kobamoto et al. |
| 2016/0284889 A1 | 9/2016 | Akimoto et al. |
| 2018/0226520 A1 | 8/2018 | Cho et al. |
| 2020/0185548 A1 | 6/2020 | Konno et al. |
| 2021/0126141 A1 | 4/2021 | Shih |

(Continued)

FOREIGN PATENT DOCUMENTS

| | | |
|---|---|---|
| CN | 103021511 B | 5/2016 |
| CN | 110634618 A | 12/2019 |
| CN | 115504674 A | 12/2022 |

(Continued)

OTHER PUBLICATIONS

English translation of WO-2017170529-A1 (Year: 2025).*

(Continued)

*Primary Examiner* — Angelo Trivisonno
(74) *Attorney, Agent, or Firm* — MARSHALL,
GERSTEIN & BORUN LLP

(57) ABSTRACT

A conductive paste and a solar cell. The conductive paste
includes a conductive powder, a first glass frit, and a second
glass frit. The first glass frit includes at least one of lead-
containing glass and bismuth-containing glass. A glass tran-
sition temperature of the second glass frit is greater than
600° C. In the conductive paste, a weight percentage of the
first glass frit ranges from 0.5% to 5%, and a weight
percentage of the second glass frit ranges from 0.5% to 10%.

20 Claims, 3 Drawing Sheets

(56)                    References Cited

U.S. PATENT DOCUMENTS

2023/0071754 A1 *   3/2023  Chai ..................... H10F 71/121

FOREIGN PATENT DOCUMENTS

| | | | |
|---|---|---|---|
| CN | 115716711 | A | 2/2023 |
| CN | 219040489 | U | 5/2023 |
| CN | 116759465 | A | 9/2023 |
| CN | 117174357 | A | 12/2023 |
| EP | 1801890 | B1 | 11/2010 |
| EP | 4456086 | A1 | 10/2024 |
| EP | 4503141 | A1 | 2/2025 |
| JP | 2014150015 | A | 8/2014 |
| KR | 10-2019-0031816 | A | 3/2019 |
| WO | WO-2017170529 | A1 * | 10/2017 ............ H10F 77/311 |
| WO | WO-2023/115716 | A1 | 6/2023 |
| WO | WO-2023/190282 | A1 | 10/2023 |

OTHER PUBLICATIONS

Office Action, European Patent Application No. 24181708.9, dated Apr. 24, 2025.
Office Action, Australian patent application No. 2024204778, dated Aug. 26, 2024.
Office Action, Australian Patent Application No. 2024204778, dated Jan. 21, 2025.

* cited by examiner

CONDUCTIVE PASTE AND SOLAR CELL

CROSS-REFERENCE TO RELATED APPLICATIONS

This application claims priority to Chinese patent application No. 202311849621.2, filed on Dec. 29, 2023, the content of which is hereby incorporated by reference in its entirety.

TECHNICAL FIELD

The present disclosure relates to the field of solar photovoltaic cell technologies, and in particular, to a conductive paste and a solar cell.

BACKGROUND

With the continuous development of solar cell technologies, people have increasingly high requirements for photoelectric conversion efficiency of cells. However, current improvement of industrial cell efficiency still faces many challenges. How to further improve performance of solar cells has become a research focus for those skilled in the art.

SUMMARY

According to various embodiments of the present disclosure, a conductive paste and a solar cell are provided.

In a first aspect, embodiments of the present disclosure provide a conductive paste, including a conductive powder, a first glass frit, and a second glass frit.

The first glass frit includes at least one of lead-containing glass and bismuth-containing glass. A glass transition temperature of the second glass frit is greater than 600° C. In the conductive paste, a weight percentage of the first glass frit ranges from 0.5% to 5%, and a weight percentage of the second glass frit ranges from 0.5% to 10%.

In an embodiment, the second glass frit does not include lead-containing glass and bismuth-containing glass.

In an embodiment, the second glass frit includes one or more selected from a group consisting of a gold-containing alloy, a silicon-containing alloy, a manganese-containing alloy, a magnesium-containing alloy, a platinum-containing alloy, a tellurium-containing alloy, a palladium-containing alloy, a lithium-containing alloy, a nickel-containing alloy, a chromium-containing alloy, a barium-containing alloy, a zinc-containing alloy, and a cesium-containing alloy.

In an embodiment, a weight percentage of the conductive powder ranges from 80% to 95%.

In an embodiment, a total weight percentage of the first glass frit and the second glass frit ranges from 1% to 15%.

In an embodiment, the conductive powder includes silver powder.

In an embodiment, the conductive powder further includes aluminum powder, and a weight percentage of the aluminum powder is no more than 1%.

In a second aspect, embodiments of the present disclosure provide a solar cell, including:

a semiconductor substrate;

an emitter arranged on a side of the semiconductor substrate; and a first electrode made of the conductive paste according to any one of the embodiments in the first aspect, arranged on a side of the emitter away from the semiconductor substrate and electrically connected to the emitter.

In an embodiment, the solar cell further includes a passivation layer group. The passivation layer group is arranged on the side of the emitter away from the semiconductor substrate; and the first electrode includes a body portion and a plurality of connecting portions; the body portion extends through part of the passivation layer group; the plurality of connecting portions are arranged at intervals on a side of the body portion adjacent to the emitter, and are in contact with the emitter.

In an embodiment, the passivation layer group includes a first passivation layer, a first antireflection layer, and a second antireflection layer stacked in a direction away from the semiconductor substrate. Silicon content of the second antireflection layer is less than that of the first antireflection layer;

the body portion extends through the second antireflection layer; and the first antireflection layer includes a first portion and a second portion; and an orthographic projection of the first portion on the semiconductor substrate does not overlap with an orthographic projection of the first electrode on the semiconductor substrate; the orthographic projection of the first electrode on the semiconductor substrate covers an orthographic projection of the second portion on the semiconductor substrate; and the second portion is provided between adjacent connecting portions.

In an embodiment, an area of orthographic projections of the plurality of connecting portions on the semiconductor substrate is a first area, and an area of the orthographic projection of the first electrode on the semiconductor substrate is a second area; and a ratio of the first area to the second area ranges from 30% to 70%.

In an embodiment, the first electrode includes first silver-containing particles and second silver-containing particles. Particle diameters of the first silver-containing particles are greater than or equal to 1 nm and less than or equal to 100 nm, and particle diameters of the second silver-containing particles are greater than 100 nm and less than or equal to 300 nm; and part of the first silver-containing particles and part of the second silver-containing particles are both in contact with the emitter.

In an embodiment, on a contact interface between the first electrode and the emitter, a quantity of particles of the first silver-containing particles is greater than a quantity of particles of the second silver-containing particles.

In an embodiment, on the contact interface between the first electrode and the emitter, the quantity of particles of the first silver-containing particles is a first value, a sum of the quantity of particles of the first silver-containing particles and the quantity of particles of the second silver-containing particles is a second value, and a ratio of the first value to the second value is no less than 80%.

In an embodiment, the emitter is made of crystalline silicon.

A distance between a peak position of the emitter and a surface of the emitter away from the semiconductor substrate ranges from 0.1 μm to 0.6 μm.

In an embodiment, a junction depth of the emitter ranges from 0.1 μm to 1 μm.

In an embodiment, the emitter is made of polycrystalline silicon or amorphous silicon, and a thickness of the emitter ranges from 20 nm to 500 nm.

In an embodiment, the semiconductor substrate is made of at least one of crystalline silicon, polycrystalline silicon, and amorphous silicon.

In an embodiment, the solar cell further includes:

a tunnel layer arranged on a side of the semiconductor substrate away from the emitter;

a doped semiconductor layer arranged on a side of the tunnel layer away from the semiconductor substrate; and a second electrode arranged on a side of the doped semiconductor layer away from the second electrode, and electrically connected to the doped semiconductor layer;

A thickness of the doped semiconductor layer ranges from 5 nm to 80 nm.

In a third aspect, embodiments of the present disclosure provide a solar cell, including:

a semiconductor substrate;

an emitter arranged on a side of the semiconductor substrate;

a passivation layer group arranged on a side of the emitter away from the semiconductor substrate; and a first electrode arranged on the side of the emitter away from the semiconductor substrate.

The first electrode includes a body portion and a plurality of connecting portions. The body portion extends through part of the passivation layer group. The plurality of connecting portions are arranged at intervals on a side of the body portion adjacent to the emitter, and are in contact with the emitter.

In an embodiment, the passivation layer group includes a first passivation layer, a first antireflection layer, and a second antireflection layer stacked in a direction away from the semiconductor substrate. Silicon content of the second antireflection layer is less than that of the first antireflection layer;

the body portion extends through the second antireflection layer; and the first antireflection layer includes a first portion and a second portion, and an orthographic projection of the first portion on the semiconductor substrate does not overlap with an orthographic projection of the first electrode on the semiconductor substrate; the orthographic projection of the first electrode on the semiconductor substrate covers an orthographic projection of the second portion on the semiconductor substrate; and the second portion is provided between adjacent connecting portions.

In an embodiment, an area of orthographic projections of the plurality of connecting portions on the semiconductor substrate is a first area, and an area of the orthographic projection of the first electrode on the semiconductor substrate is a second area; and a ratio of the first area to the second area ranges from 30% to 70%.

In an embodiment, the first electrode includes first silver-containing particles and second silver-containing particles; particle diameters of the first silver-containing particles are greater than or equal to 1 nm and less than or equal to 100 nm, and particle diameters of the second silver-containing particles are greater than 100 nm and less than or equal to 300 nm; and part of the first silver-containing particles and part of the second silver-containing particles are both in contact with the emitter.

In an embodiment, on a contact interface between the first electrode and the emitter, a quantity of particles of the first silver-containing particles is greater than a quantity of particles of the second silver-containing particles.

In an embodiment, on the contact interface between the first electrode and the emitter, the quantity of particles of the first silver-containing particles is a first value, a sum of the quantity of particles of the first silver-containing particles and the quantity of particles of the second silver-containing particles is a second value, and a ratio of the first value to the second value is no less than 80%.

In an embodiment, the emitter is made of crystalline silicon; and a distance between a peak position of the emitter and a surface of the emitter away from the semiconductor substrate ranges from 0.1 μm to 0.6 μm.

In an embodiment, a junction depth of the emitter ranges from 0.1 μm to 1 μm.

In an embodiment, the emitter is made of polycrystalline silicon or amorphous silicon, and a thickness of the emitter ranges from 20 nm to 500 nm.

In an embodiment, the semiconductor substrate is made of at least one of crystalline silicon, polycrystalline silicon, and amorphous silicon.

In an embodiment, the solar cell further includes:

a tunnel layer arranged on a side of the semiconductor substrate away from the emitter;

a doped semiconductor layer arranged on a side of the tunnel layer away from the semiconductor substrate; and a second electrode arranged on a side of the doped semiconductor layer away from the second electrode, and electrically connected to the doped semiconductor layer.

A thickness of the doped semiconductor layer ranges from 5 nm to 80 nm.

BRIEF DESCRIPTION OF THE DRAWINGS

In order to more clearly illustrate the technical solutions in embodiments or exemplary embodiments of the present disclosure, the accompanying drawings used in the description of the embodiments or exemplary embodiments will be briefly introduced below. Apparently, the accompanying drawings in the following description only illustrate some embodiments of the present disclosure, and other drawings can be obtained by those of ordinary skill in the art from the provided drawings without creative efforts.

ILLUSTRATION FOR REFERENCE NUMERALS

Figure 1:
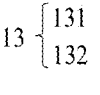
FIG. 1 is a partial cross-sectional schematic view of a solar cell according to an embodiment of the present disclosure.
Figure 1:
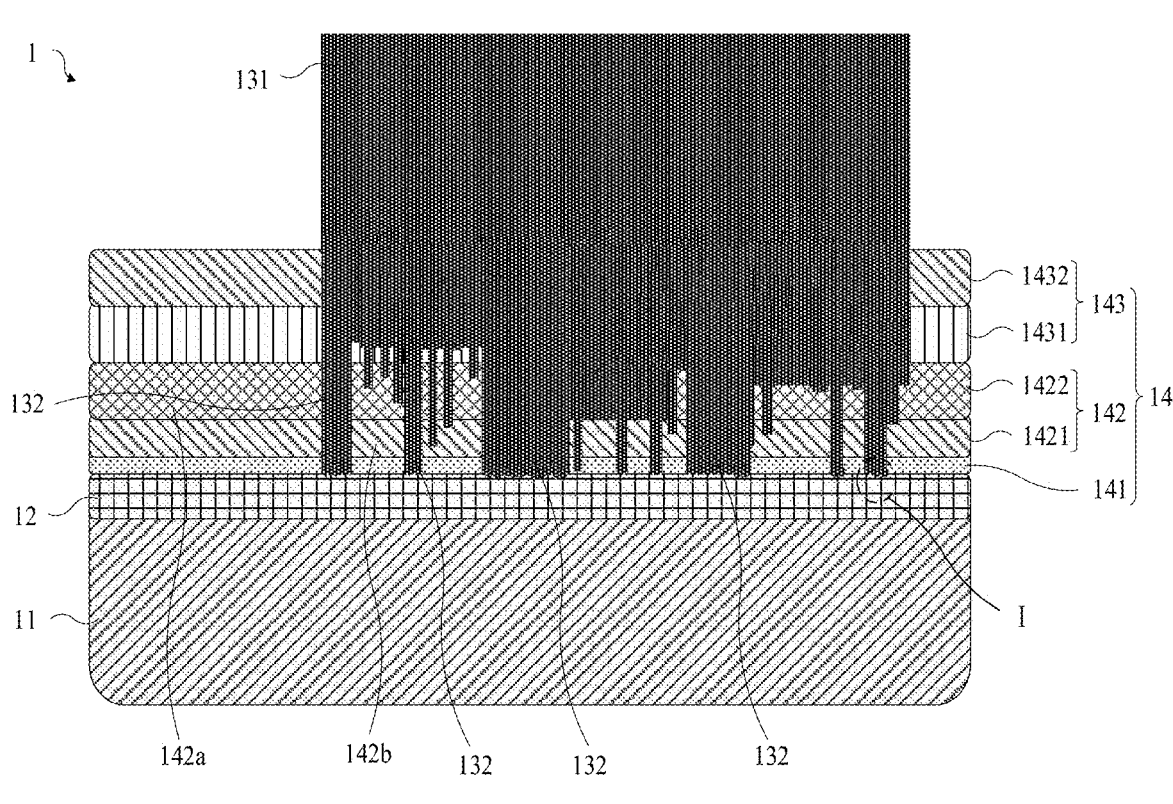

1: solar cell; 11: semiconductor substrate; 12: emitter; 13: first electrode; 13a: silver-containing particle; 131: body portion; 132: connecting portion; 14: passivation layer group; 141: first passivation layer; 142: first antireflection layer; 142b: first portion; 142b: second portion; 1421: first sublayer; 1422: second sublayer; 143: second antireflection layer; 1431: third sublayer; 1432: fourth sublayer; 15: tunnel layer; 16: doped semiconductor layer; 17: second electrode; 18: dielectric layer.

DETAILED DESCRIPTION

In order to make the objects, technical solutions, and advantages of the present disclosure clearer, specific implementations of the present disclosure will be described below in detail with reference to the accompanying drawings. In the following description, numerous specific details are set forth in order to provide a thorough understanding of the present disclosure. However, the present disclosure can be implemented in many other manners different from those described herein, and those skilled in the art can make similar improvements without departing from the connotation of the present disclosure. Therefore, the present disclosure is not limited by specific embodiments disclosed below.

Unless defined otherwise, all technical and scientific terms used herein have the same meanings as would generally understood by those skilled in the technical field of the present disclosure. The terms used herein in the specification of the present disclosure are for the purpose of describing specific embodiments only, and are not intended to limit the present disclosure.

It should be understood that when an element or layer is referred to as being "on", "adjacent to", "connected to", or "coupled to" another element or layer, the element or layer may be directly on, adjacent to, connected to, or coupled to the another element or layer, or an intermediate element or layer may be disposed therebetween. On the contrary, when an element is referred to as being "directly on", "directly adjacent to", "directly connected to", or "directly coupled to" another element or layer, no intermediate element or layer may be disposed therebetween. It should be understood that although terms such as first, second, and third may be used to describe various elements, components, regions, layers, doped types and/or parts, the elements, components, regions, layers, doped types and/or parts may not be limited to such terms. Such terms are used only to distinguish one element, component, region, layer, doped type, or part from another element, component, region, layer, doped type, or part. Thus, without departing from the teaching of the present disclosure, a first element, component, region, layer, doped type, or part may be referred to as a second element, component, region, layer, doped type, or part.

Spatial relationship terms such as "under", "underneath", "below", "beneath", "over", and "above" may be used for illustrative purposes to describe a relationship between one element or feature and another element or feature illustrated in the figures. It should be understood that, in addition to the orientations illustrated in the figures, the spatial relationship terms are intended to further include different orientations of the device in use and operation. For example, if the device in the figures is flipped over, the element or feature described as "below", "underneath" or "under" another element or feature may be oriented as "on" the another element or feature. Thus, the exemplary terms "below" and "under" may include two orientations of above and below. In addition, the device may be orientated in other ways (e.g., rotated by 90-degree or otherwise orientated), and thus spatial descriptors used herein may be interpreted accordingly.

In use, the singular forms of "a", "one", and "the" may also include plural forms, unless otherwise clearly specified in the context. It should be further understood that the terms "include/comprise", "have" and/or like specify the presence of the features, integers, steps, operations, components, parts, or combinations thereof, but may not exclude the presence or addition of one or more of other features, integers, steps, operations, components, parts, or combinations thereof. In addition, in the specification, the term "and/or" may include any and all combinations of associated listed items.

Embodiments of the present disclosure are described herein with reference to cross-sectional views of schematic views of ideal embodiments (and intermediate structures) of the present disclosure. Correspondingly, illustrated shape variations caused by, for example, manufacturing techniques and/or tolerances, may be expected. Thus, the embodiments of the present disclosure may not be limited to the specific shapes of the regions illustrated herein, but may include shape deviations caused by, for example, the manufacturing techniques. For example, an implanted region illustrated as rectangular in shape, typically, has rounded or curved features and/or a gradient of implantation concentration at its edges, rather than a binary change from an implanted region to a non-implanted region. Likewise, a buried region formed by implantation may result in some implantation in the region between the buried region and a surface being passed through during the implantation. Thus, the region shown in the drawings is generally schematic, and the illustrated shape is not intended to show the actual shape of the region of the device, and is not intended to limit the scope of the present disclosure.

In a first aspect, embodiments of the present disclosure provide a conductive paste, including conductive powder, first glass frit, and second glass frit. The first glass frit includes at least one of lead-containing glass or bismuth-containing glass. A glass transition temperature of the second glass frit is greater than 600° C. Herein, the second glass frit refers to high transition temperature glass (whose glass transition temperature is greater than 600° C.). In the conductive paste, the first glass frit has a weight percentage ranging from 0.5% to 5%, and the second glass frit has a weight percentage ranging from 0.5% to 10%.

It is to be noted that the lead-containing glass and the bismuth-containing glass are mainly used to corrode a passivation film layer to form contact holes, and the high transition temperature glass is mainly used to enhance densification of the conductive paste and adhesion of the conductive paste to a silicon substrate.

In the related art, the first glass frit has a weight percentage typically greater than 5%. In the embodiments of the present disclosure, with the first glass frit having the weight percentage less than 5%, a corrosion degree of the passivation film layer by the conductive paste can be reduced, a passivation area of the passivation film layer can be significantly increased, a better passivation effect is achieved, which is beneficial to improve efficiency of the solar cell. In the embodiments of the present disclosure, with the addition of the second glass frit and with the second glass frit having the weight percentage ranging from 0.5% to 10%, on the one hand, densification of the conductive paste and adhesion of the conductive paste to the silicon substrate can be enhanced, and on the other hand, a high transition temperature can prevent further corrosion of the passivation film layer during laser-induced sintering, thereby helping retain the passivation film layer below the electrode.

In an example, the weight percentage of the first glass frit may be 0.5%, 1%, 1.5%, 3%, 3.6%, 4%, 5%, or in a range between any two of the above values.

In another example, the weight percentage of the second glass frit may be 0.5%, 1%, 1.8%, 3.2%, 3.6%, 4.5%, 5%, 6%, 8%, 8.9%, 10%, or in a range between any two of the above values.

In an embodiment, the second glass frit does not include lead-containing glass and bismuth-containing glass. In this way, it is beneficial to reduce a corrosion degree of the passivation film layer by the conductive paste, significantly improving a passivation area of the passivation film layer, and achieving a better passivation effect.

In an example, the second glass frit includes one or more selected from a group consisting of a gold-containing alloy, a silicon-containing alloy, a manganese-containing alloy, a magnesium-containing alloy, a platinum-containing alloy, a tellurium-containing alloy, a palladium-containing alloy, a lithium-containing alloy, a nickel-containing alloy, a chromium-containing alloy, a barium-containing alloy, a zinc-containing alloy, and a cesium-containing alloy, to enhance an adhesive bonding capability of the conductive paste to the silicon substrate at a low sintering temperature.

In an embodiment, a weight percentage of the conductive powder ranges from 80% to 95%. Exemplarily, the weight percentage of the conductive powder is 80%, 83%, 86%, 90%, 92%, 95%, or in a range between any two of the above values.

With the weight percentage of the conductive powder within the above range, it is beneficial to reduce conductive resistance of the electrode and improve efficiency of the solar cell.

In an embodiment, a total weight percentage of the first glass frit and the second glass frit ranges from 1% to 15%. Exemplarily, the total weight percentage of the first glass frit and the second glass frit is 1%, 3%, 5%, 8%, 11%, 12%, 14%, 15%, or in a range between any two of the above values.

With the weight percentage of the frit within the above range, a corrosion degree of the passivation film layer by the conductive paste can be reduced, a passivation area of the passivation film layer can be significantly increased, and a better passivation effect can be achieved.

In an embodiment, the conductive powder includes silver powder. Exemplarily, the silver powder may be silver alloy powder. In this way, after the conductive paste is sintered, the silver powder may form silver-containing particles. The silver-containing particles can directly contact the emitter, which helps reduce contact resistance between the electrode and the emitter, thereby improving reliability of the solar cell.

It is to be noted that the conductive powder may include only silver powder or include other metal powders, which is not limited in the embodiments of the present disclosure.

In an embodiment, the conductive powder further includes aluminum powder. A weight percentage of the aluminum powder is no more than 1%. In an example, the weight percentage of the aluminum powder is 0.01%, 0.3%, 0.5%, 0.8%, or 1%. With the weight percentage of the aluminum powder no more than 1%, on the one hand, etching of the emitter can be reduced, and on the other hand, bonding strength of the emitter and the electrode after sintering can be improved.

In an embodiment, the conductive powder does not include aluminum powder. It may be understood that conventional conductive paste typically includes the aluminum powder. However, the aluminum powder easily over-etches the emitter and increases the contact resistance between the electrode and the emitter. In the embodiments of the present disclosure, the conductive paste is a silver paste. That is, the conductive powder of the conductive paste only includes the silver powder and does not include the aluminum powder, which can reduce the etching of the emitter and improve the contact resistance between the electrode and the emitter.

It may be understood that the conductive paste further includes an organic carrier. The organic carrier is used as a mixed solvent to mix the conductive powder with other additives in the conductive paste to adjust adhesion and fluidity of the conductive paste. In some embodiments, the organic carrier includes an organic binder, an organic solvent, a thixotropic agent, a surfactant, and the like. For example, the binder is one or more selected from the group consisting of ethyl cellulose, polyacrylic acid, phenolic resin, polyvinyl butyral, polyethylene resin, polyurethane resin, polyester resin, polycarbonate, and rosin derivatives, or any combination thereof. The organic solvent is one selected from the group consisting of carbitol, terpineol, hexyl carbitol, butyl carbitol acetate, dimethyl adipate glycol ether, and butyl carbitol, or any combination thereof, or the like. The thixotropic agent is one selected from the group consisting of castor oil derivatives, polyamide, polyamide derivatives, fumed silica, carboxylic acid derivatives, and fatty acid derivatives, or any combination thereof, or the like. The surfactant is one selected from the group consisting of polyethylene oxide, benzotriazole, polyethylene glycol, tallow diamine dioleate, poly(ethylene glycol) acetic acid, linoleic acid, stearic acid, lauric acid, oleic acid, capric acid, myristic acid, palmitic acid, stearate, and palmitate, or any combination thereof.

According to the conductive paste in the embodiments of the present disclosure, with the weight percentage of the first glass frit ranging from 0.5% to 5% and the weight percentage of the second glass frit (high transition temperature glass) ranging from 0.5% to 10%, content of the first glass frit is reduced, and content of the high transition temperature glass is increased compared with the related art. On the one hand, a corrosion degree of a passivation film layer by the conductive paste is reduced, a passivation area of the passivation film layer is significantly increased, a better passivation effect is achieved, and it is beneficial to improve efficiency of the solar cell. On the other hand, densification of the conductive paste and adhesion of the conductive paste to the silicon substrate can be enhanced, helping improve reliability of the solar cell, and further corrosion of the passivation film layer during laser-induced sintering can be prevented, thereby helping retain the passivation film layer below an electrode.

Figure 2:
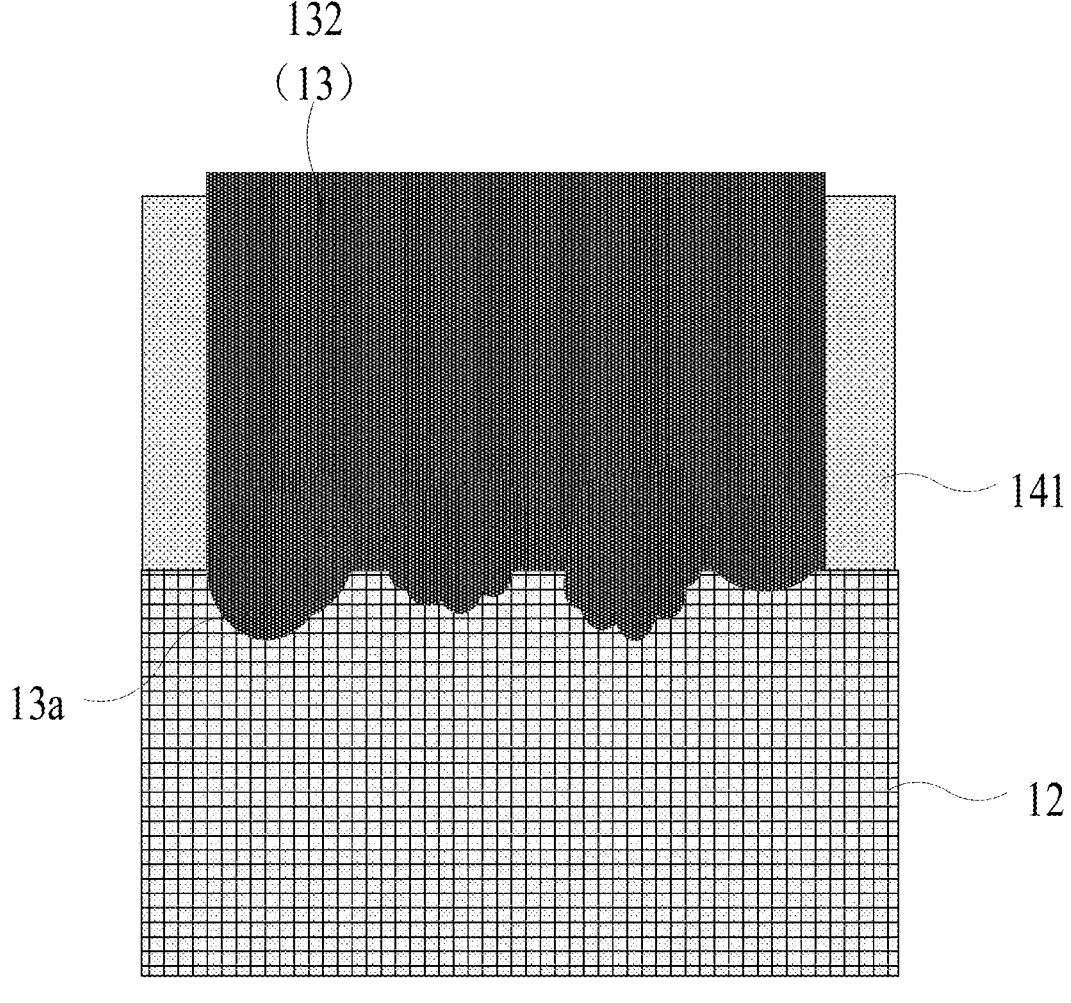
FIG. 2 is a partial enlarged view of Portion I in FIG. 1.

In a second aspect, referring to FIGS. 1 and 2, embodiments of the present disclosure provide a solar cell 1, including a semiconductor substrate 11, an emitter 12, and a first electrode 13 made of the conductive paste in any one of the embodiments in the first aspect. The emitter 12 is arranged on a side of the semiconductor substrate 11. The first electrode 13 is arranged on a side of the emitter 12 away from the semiconductor substrate 11 and electrically connected to the emitter 12.

According to the solar cell 1 in the embodiments of the present disclosure, by using the conductive paste in the first aspect to manufacture the first electrode 13, a certain passivation film layer can be retained below the first electrode 13, so that a passivation area of the passivation film layer can be significantly increased, a better passivation effect is achieved, and it is beneficial to improve the efficiency of the solar cell 1.

In an embodiment, referring to FIG. 1, the solar cell 1 further includes a passivation layer group 14. The passivation layer group 14 is arranged on the side of the emitter 12 away from the semiconductor substrate 11. The first electrode 13 includes a body portion 131 and a plurality of connecting portions 132. The body portion 131 extends through part of the passivation layer group 14. The plurality of connecting portions 132 are arranged at intervals on a side of the body portion 131 adjacent to the emitter 12, and are in contact with the emitter 12.

In this way, the passivation layer group 14 is retained between adjacent connecting portions 132, which maximizes the passivation area, thereby helping achieve the better passivation effect. It is to be noted that the body portion 131 does not completely extend through the passivation layer group 14, but contacts the emitter 12 through the plurality of connecting portions 132 arranged at intervals, because the first electrode 13 is made of the conductive paste in the first aspect. Such conductive paste is less corrosive during sintering, therefore, part of the passivation layer group 14 may be retained between the body portion 131 and the emitter 12.

In an embodiment, the passivation layer group 14 includes a first passivation layer 141, a first antireflection layer 142, and a second antireflection layer 143 stacked in a direction away from the semiconductor substrate 11. Silicon content of the second antireflection layer 143 is less than that of the first antireflection layer 142. Herein, the first antireflection layer 142 is a silicon-rich layer.

The body portion 131 extends through the second antireflection layer 143. The first antireflection layer 142 includes a first portion 142a and a second portion 142b. An orthographic projection of the first portion 142a on the semiconductor substrate 11 does not overlap with an orthographic projection of the first electrode 13 on the semiconductor substrate 11. The orthographic projection of the first electrode 13 on the semiconductor substrate 11 covers an orthographic projection of the second portion 142b on the semiconductor substrate 11. The second portion 142b is provided between adjacent connecting portions 132. Herein, the second antireflection layer 143 retained between the body portion 131 and the emitter 12 is the second portion 142b.

By retaining part of the silicon-rich layer between the first electrode 13 and the emitter 12, on the one hand, an antireflection effect can be improved and absorption of light can be increased, and on the other hand, the passivation effect can be improved.

It is to be noted that the first antireflection layer 142 may have a multi-layer structure. In the multi-layer structure, each layer may be made of silicon oxide, silicon nitride, or silicon oxynitride. The second antireflection layer 143 may have a multi-layer structure. In the multi-layer structure, each layer may be made of silicon oxide, silicon nitride, or silicon oxynitride. The first passivation layer 141 may have a single-layer structure or a multi-layer structure. The first passivation layer 141 may be made of at least one of aluminum oxide, silicon oxide, silicon nitride, and silicon oxynitride. In addition, the first passivation layer 141 may be formed by chemical deposition.

In an example, referring to FIG. 1, the first antireflection layer 142 includes a first sublayer 1421 and a second sublayer 1422 sequentially stacked in a direction away from the semiconductor substrate 11. The first sublayer 1421 and the second sublayer 1422 are both made of silicon nitride. Silicon content of the first sublayer 1421 is greater than that of the second sublayer 1422. The second antireflection layer 143 includes a third sublayer 1431 and a fourth sublayer 1432 sequentially stacked in a direction away from the semiconductor substrate 11. The third sublayer 1431 is made of silicon oxynitride, and the fourth sublayer 1432 is made of silicon oxide. Silicon content of the third sublayer 1431 is greater than that of the second sublayer 1422.

In an embodiment, an area of orthographic projections of the plurality of connecting portions 132 on the semiconductor substrate 11 is referred to as a first area, and an area of the orthographic projection of the first electrode 13 on the semiconductor substrate 11 is referred to as a second area. A ratio of the first area to the second area ranges from 30% to 70%. Exemplarily, the ratio of the first area to the second area may be 30%, 40%, 49%, 56%, 64%, 70%, or in a range between any two of the above values.

With the ratio of the first area to the second area within the above range, the passivation area can be maximized, thereby helping achieve the better passivation effect.

In an embodiment, the first electrode 13 includes first silver-containing particles and second silver-containing particles. Particle diameters of the first silver-containing particles are greater than or equal to 1 nm and less than or equal to 100 nm, and particle diameters of the second silver-containing particles are greater than 100 nm and less than or equal to 300 nm. Part of the first silver-containing particles and part of the second silver-containing particles are both in contact with the emitter 12.

It is to be noted that after the conductive paste in the first aspect is sintered, the conductive powder in the conductive paste forms silver-containing particles 13a. The silver-containing particles 13a include first silver-containing particles and second silver-containing particles. Referring to FIG. 2, on a contact interface between the first electrode 13 and the emitter 12, the silver-containing particles 13a is in direct contact with the emitter. In this way, by arranging the silver-containing particles to be in direct contact with the emitter 12, it is beneficial to reduce contact resistance between the electrode and the emitter 12, thereby improving reliability of the solar cell 1.

In an embodiment, on the contact interface between the first electrode 13 and the emitter 12, quantity of particles of the first silver-containing particles is greater than that of particles of the second silver-containing particles. By arranging the quantity of particles of the first silver-containing particles to be greater than that of particles of the second silver-containing particles, a probability of contact between the silver-containing particles 13a and the emitter can be increased, which helps reduce the contact resistance between the electrode and the emitter 12, thereby improving the reliability of the solar cell 1.

In an embodiment, on the contact interface between the first electrode 13 and the emitter 12, the quantity of particles of the first silver-containing particles is referred to as a first value, a sum of the quantity of particles of the first silver-containing particles and the quantity of particles of the second silver-containing particles is referred to as a second value, and a ratio of the first value to the second value is no less than 80%. Exemplarily, the ratio of the first value to the second value may be 80%, 85%, 90%, 92%, 95%, 98%, or 99%.

In this way, the silver-containing particles with small particle diameters have a larger proportion, which can further increase the probability of contact between the silver-containing particles 13a and the emitter, and help reduce the contact resistance between the electrode and the emitter 12, thereby improving the reliability of the solar cell 1.

In an embodiment, doping concentration at a peak position of the emitter 12 is greater than $1\times10^{19}/cm^3$. It is to be noted that the doping concentration of the emitter 12 first increases and then decreases in a direction from the side of the emitter 12 away from the semiconductor substrate 11 to the side of the emitter 12 adjacent to the semiconductor substrate 11. Herein, the peak position of the emitter 12 refers to a position where the doping concentration of the emitter 12 is maximum.

With the doping concentration at the peak position of the emitter 12 greater than $1\times10^{19}/cm^3$, it can be ensured that the emitter 12 has good conductive properties.

In an embodiment, the emitter 12 is made of crystalline silicon, and a distance between the peak position of the emitter 12 and a surface of the emitter 12 away from the semiconductor substrate 11 ranges from 0.1 μm to 0.6 μm. Herein, the distance between the peak position of the emitter 12 and the surface of the emitter 12 away from the semiconductor substrate 11 is a depth of the peak position of the emitter 12. Exemplarily, the depth of the peak position of the emitter 12 may be 0.1 μm, 0.3 μm, 0.4 μm, 0.5 μm, 0.6 μm or in a range between any two of the above values.

In an embodiment, the emitter 12 is made of crystalline silicon, and a junction depth of the emitter 12 ranges from 0.1 μm to 1 μm. Exemplarily, the junction depth of the emitter 12 may be 0.1 μm, 0.3 μm, 0.5 μm, 0.8 μm, 1 μm, or in a range between any two of the above values.

It is to be noted that the junction depth of the emitter 12 in the related art is generally greater than 1.2 μm. In the embodiments of the present disclosure, when the first electrode 13 is made of the conductive paste in the first aspect, since the conductive paste is less corrosive during sintering such that an ablation depth is reduced, the junction depth of the emitter 12 may be relatively small and the peak position of the emitter 12 may also be shallower. It may be understood that the relatively small junction depth of the emitter 12 can reduce manufacturing costs of the emitter 12.

In an embodiment, the emitter is made of polycrystalline silicon or amorphous silicon, and a thickness of the emitter ranges from 20 nm to 500 nm. Exemplarily, the thickness of the emitter may be 20 nm, 80 nm, 160 nm, 250 nm, 300 nm, 380 nm, 430 nm, 500 nm, or in a range between any two of the above values.

In this way, it is beneficial to form a passivated contact structure on a front surface of the solar cell 1, which can further reduce carrier recombinations in a metal region, and improve performance of the solar cell 1.

In an embodiment, the semiconductor substrate 11 is made of at least one of crystalline silicon, polycrystalline silicon, and amorphous silicon. In an example, the semiconductor substrate 11 is made of crystalline silicon. In an example, the semiconductor substrate 11 is made of polycrystalline silicon. In an example, the semiconductor substrate 11 is made of amorphous silicon. Through the above configuration, a wider range of material selection range for the semiconductor substrate 11 can be realized, and limitations on material selection for the semiconductor substrate 11 can be reduced.

Figure 3:
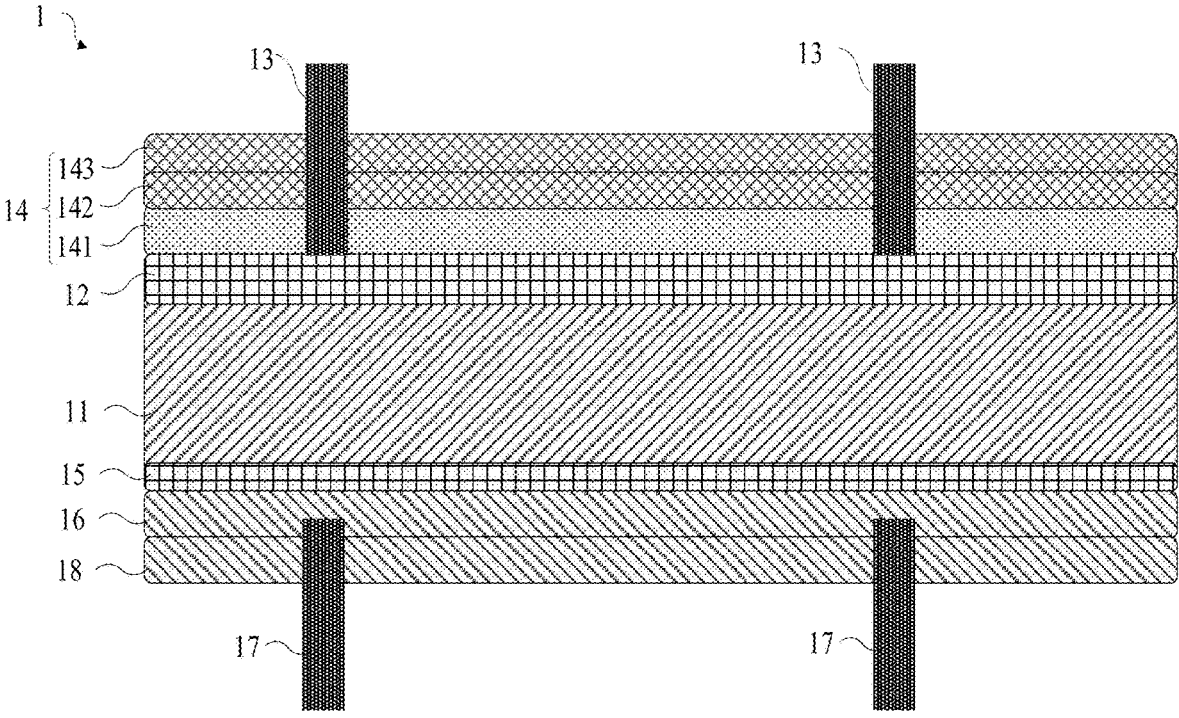
FIG. 3 is a partial cross-sectional schematic view of solar cell according to another embodiment of the present disclosure.

In an embodiment, referring to FIG. 3, the solar cell 1 further includes a tunnel layer 15, a doped semiconductor layer 16, and a second electrode 17. The tunnel layer 15 is arranged on a side of the semiconductor substrate 11 away from the emitter 12. The doped semiconductor layer 16 is arranged on a side of the tunnel layer 15 away from the semiconductor substrate 11. The second electrode 17 is arranged on a side of the doped semiconductor layer 16 away from the second electrode 17, and electrically connected to the doped semiconductor layer 16. A thickness of the doped semiconductor layer 16 ranges from 5 nm to 80 nm. Exemplarily, the thickness of the doped semiconductor layer 16 may be 5 nm, 15 nm, 20 nm, 30 nm, 50 nm, 60 nm, 70 nm, 80 nm, or in a range between any two of the above values.

It is to be noted that, in the related art, the thickness of the doped semiconductor layer 16 is typically greater than 80 nm. In the embodiments of the present disclosure, since the conductive paste used to make the first electrode 13 is less corrosive, a sintering temperature of the first electrode 13 can be reduced. Further, when the first electrode 13 and the second electrode 17 are sintered at the same time, an ablation depth of the second electrode 17 is reduced, so that the thickness of the doped semiconductor layer 16 can be reduced to a value less than 80 nm, which helps improve the performance of the solar cell 1.

Exemplarily, the tunnel layer 15 may be made of a dielectric material, which is one or more selected from the group consisting of silicon oxide, aluminum oxide, silicon nitride, silicon oxynitride, magnesium fluoride, amorphous silicon, polycrystalline silicon, silicon carbide, and titanium oxide.

In an embodiment, referring to FIG. 3, the solar cell 1 further includes a dielectric layer 18. The dielectric layer 18 is arranged on a side of the doped semiconductor layer 16 away from the semiconductor substrate 11. The dielectric layer 18 may be made of a dielectric material, which is one or more selected from the group consisting of silicon oxide, aluminum oxide, silicon nitride, silicon oxynitride, magnesium fluoride, amorphous silicon, polycrystalline silicon, silicon carbide, and titanium oxide.

In a third aspect, referring to FIGS. 1 and 2, embodiments of the present disclosure provide a solar cell 1, including a semiconductor substrate 11, an emitter 12, a passivation layer group 14, and a first electrode 13. The emitter 12 is arranged on a side of the semiconductor substrate 11. The passivation layer group 14 is arranged on a side of the emitter 12 away from the semiconductor substrate 11. The first electrode 13 is arranged on the side of the emitter 12 away from the semiconductor substrate 11.

The first electrode 13 includes a body portion 131 and a plurality of connecting portions 132 The body portion 131 extends through part of the passivation layer group 14. The plurality of connecting portions 132 are arranged at intervals on a side of the body portion 131 adjacent to the emitter 12, and are in contact with the emitter 12.

According to the solar cell 1 in the embodiments of the present disclosure, by retaining a certain passivation film layer (the passivation layer group 14) below the first electrode 13, a passivation area of the passivation film layer can be significantly increased, a better passivation effect can be achieved, which is beneficial to improve efficiency of the solar cell 1.

It is to be noted that the structure of the solar cell 1 in the third aspect may be the same as that of the solar cell 1 in the second aspect, which is not repeatedly described in detail again in the embodiments of the present disclosure.

The technical features of the above-mentioned embodiments can be combined arbitrarily. In order to make the description concise, not all possible combinations of the technical features are described in the embodiments. However, as long as there is no contradiction in the combination of these technical features, the combinations should be considered as in the scope of the specification.

The above-described embodiments are only several implementations of the present disclosure, and the descriptions are relatively specific and detailed, but they should not be construed as limiting the scope of the present disclosure. It should be understood by those of ordinary skill in the art that various variants and improvements can be made without departing from the concept of the present disclosure, and all fall within the protection scope of the present disclosure. Therefore, the patent protection scope of the present disclosure shall be defined by the appended claims.

The invention claimed is:

1. A solar cell, comprising:
   a semiconductor substrate;

an emitter arranged on a side of the semiconductor substrate;

a passivation layer group arranged on a side of the emitter away from the semiconductor substrate; and a first electrode arranged on the side of the emitter away from the semiconductor substrate;

wherein the first electrode comprises a body portion and a plurality of connecting portions, wherein the body portion extends through part of the passivation layer group; and the plurality of connecting portions are spaced apart on a side of the body portion adjacent to the emitter, and are in contact with the emitter.

2. The solar cell of claim 1, wherein the first electrode is made of a conductive paste electrically connected to the emitter; and wherein the conductive paste comprises:

a conductive powder; and a first glass frit comprising at least one of lead-containing glass and bismuth-containing glass.

3. The solar cell according to claim 1, wherein the passivation layer group comprises a first passivation layer, a first antireflection layer, and a second antireflection layer stacked in a direction away from the semiconductor substrate; silicon content of the second antireflection layer is less than that of the first antireflection layer;

the body portion extends through the second antireflection layer; and the first antireflection layer comprises a first portion and a second portion, wherein an orthographic projection of the first portion on the semiconductor substrate does not overlap with an orthographic projection of the first electrode on the semiconductor substrate; the orthographic projection of the first electrode on the semiconductor substrate covers an orthographic projection of the second portion on the semiconductor substrate; and the second portion is provided between adjacent connecting portions.

4. The solar cell according to claim 2, wherein an area of orthographic projections of the plurality of connecting portions on the semiconductor substrate is a first area; and an area of the orthographic projection of the first electrode on the semiconductor substrate is a second area; and a ratio of the first area to the second area ranges from 30% to 70%.

5. The solar cell according to claim 2, wherein the first electrode comprises first silver-containing particles and second silver-containing particles;

particle diameters of the first silver-containing particles are greater than or equal to 1 nm and less than or equal to 100 nm, and particle diameters of the second silver-containing particles are greater than 100 nm and less than or equal to 300 nm; and part of the first silver-containing particles and part of the second silver-containing particles are in contact with the emitter.

6. The solar cell according to claim 5, wherein on a contact interface between the first electrode and the emitter, a quantity of particles of the first silver-containing particles is greater than a quantity of particles of the second silver-containing particles.

7. The solar cell according to claim 6, wherein on the contact interface between the first electrode and the emitter, the quantity of particles of the first silver-containing particles is a first value; a sum of the quantity of particles of the first silver-containing particles and the quantity of particles of the second silver-containing particles is a second value; and a ratio of the first value to the second value is no less than 80%;

wherein the conductive paste further comprises: a second glass frit having a glass transition temperature greater than 600° C.; wherein in the conductive paste, a weight percentage of the first glass frit ranges from 0.5% to 5%, and a weight percentage of the second glass frit ranges from 0.5% to 10%.

8. The solar cell according to claim 2, further comprising:

a tunnel layer arranged on a side of the semiconductor substrate away from the emitter;

a doped semiconductor layer arranged on a side of the tunnel layer away from the semiconductor substrate; and a second electrode arranged on a side of the doped semiconductor layer away from the tunnel layer, and electrically connected to the doped semiconductor layer;

wherein a thickness of the doped semiconductor layer ranges from 5 nm to 80 nm.

9. The solar cell according to claim 1, wherein the passivation layer group comprises a first passivation layer, a first antireflection layer, and a second antireflection layer stacked in a direction away from the semiconductor substrate, and silicon content of the second antireflection layer is less than that of the first antireflection layer;

the body portion extends through the second antireflection layer; and the first antireflection layer comprises a first portion and a second portion, and wherein an orthographic projection of the first portion on the semiconductor substrate does not overlap with an orthographic projection of the first electrode on the semiconductor substrate; the orthographic projection of the first electrode on the semiconductor substrate covers an orthographic projection of the second portion on the semiconductor substrate; and the second portion is provided between adjacent connecting portions.

10. The solar cell according to claim 9, wherein an area of orthographic projections of the plurality of connecting portions on the semiconductor substrate is a first area, and an area of the orthographic projection of the first electrode on the semiconductor substrate is a second area; and a ratio of the first area to the second area ranges from 30% to 70%.

11. The solar cell according to claim 1, wherein the first electrode comprises first silver-containing particles and second silver-containing particles;

wherein particle diameters of the first silver-containing particles are greater than or equal to 1 nm and less than or equal to 100 nm, and particle diameters of the second silver-containing particles are greater than 100 nm and less than or equal to 300 nm; and part of the first silver-containing particles and part of the second silver-containing particles are both in contact with the emitter.

12. The solar cell according to claim 11, wherein on a contact interface between the first electrode and the emitter, a quantity of particles of the first silver-containing particles is greater than a quantity of particles of the second silver-containing particles.

13. The solar cell according to claim 12, wherein on the contact interface between the first electrode and the emitter, the quantity of particles of the first silver-containing particles is a first value, a sum of the quantity of particles of the first silver-containing particles and the quantity of particles of the second silver-containing particles is a second value; and a ratio of the first value to the second value is no less than 80%.

14. The solar cell according to claim 1, wherein the emitter is made of crystalline silicon; and a distance between a peak position of the emitter and a surface of the emitter away from the semiconductor substrate ranges from 0.1 μm to 0.6 μm; and/or a junction depth of the emitter ranges from 0.1 μm to 1 μm.

15. The solar cell according to claim 1, further comprising:

a tunnel layer arranged on a side of the semiconductor substrate away from the emitter;

a doped semiconductor layer arranged on a side of the tunnel layer away from the semiconductor substrate; and a second electrode arranged on a side of the doped semiconductor layer away from the tunnel layer, and electrically connected to the doped semiconductor layer;

wherein a thickness of the doped semiconductor layer ranges from 5 nm to 80 nm.

16. The solar cell according to claim 1, wherein the first electrode is made of a conductive paste, the conductive paste comprising:

a conductive powder;

a first glass frit comprising at least one of lead-containing glass and bismuth-containing glass; and a second glass frit having a glass transition temperature greater than 600° C.;

wherein in the conductive paste, a weight percentage of the first glass frit ranges from 0.5% to 5%, and a weight percentage of the second glass frit ranges from 0.5% to 10%.

17. The conductive paste according to claim 16, wherein the second glass frit comprises one or more selected from a group consisting of a gold-containing alloy, a silicon-containing alloy, a manganese-containing alloy, a magnesium-containing alloy, a platinum-containing alloy, a tellurium-containing alloy, a palladium-containing alloy, a lithium-containing alloy, a nickel-containing alloy, a chromium-containing alloy, a barium-containing alloy, a zinc-containing alloy, and a cesium-containing alloy.

18. The conductive paste according to claim 16, wherein a total weight percentage of the first glass frit and the second glass frit ranges from 1% to 15%.

19. The conductive paste according to claim 16, wherein the conductive powder comprises silver powder;

wherein the conductive powder further comprises aluminum powder, and a weight percentage of the aluminum powder is no more than 1%.

20. The solar cell according to claim 1, wherein the plurality of connecting portions are arranged at uneven intervals on the side of the body portion.

* * * * *